(12) United States Patent
Wang

(10) Patent No.: US 7,072,158 B2
(45) Date of Patent: Jul. 4, 2006

(54) ELECTROSTATIC DISCHARGE PROTECTION CIRCUIT

(75) Inventor: Tai-Ho Wang, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 174 days.

(21) Appl. No.: 10/707,870

(22) Filed: Jan. 20, 2004

(65) Prior Publication Data

US 2005/0088791 A1    Apr. 28, 2005

(30) Foreign Application Priority Data

Oct. 28, 2003   (TW) ............................... 92129873 A

(51) Int. Cl.
*H02H 9/00*    (2006.01)
(52) U.S. Cl. ..................................... 361/56
(58) Field of Classification Search ................. 361/56
See application file for complete search history.

(56) References Cited

U.S. PATENT DOCUMENTS

| | | | | |
|---|---|---|---|---|
| 4,858,055 A | * | 8/1989 | Okitaka ....................... 361/56 |
| 5,631,793 A | * | 5/1997 | Ker et al. ...................... 361/56 |
| 6,256,184 B1 | * | 7/2001 | Gauthier Jr. et al. ........ 361/111 |
| 6,327,126 B1 | * | 12/2001 | Miller et al. ................... 361/56 |
| 6,351,364 B1 | * | 2/2002 | Chen et al. .................. 361/111 |
| 6,724,603 B1 | * | 4/2004 | Miller et al. ................. 361/111 |

\* cited by examiner

*Primary Examiner*—Phuong T. Vu
*Assistant Examiner*—Scott Bauer
(74) *Attorney, Agent, or Firm*—Jiang Chyun IP Office

(57) ABSTRACT

An electrostatic discharge (ESD) protection circuit is disclosed, which comprises a first common conductive line, a first diode, a P-type transistor and an N-type transistor. A cathode of the first diode is coupled to the first common conductive line, and an anode of the first diode is coupled to the first system voltage. A first S/D terminal and a gate terminal of the first P-type transistor is coupled to the first system voltage and a second S/D terminal of the first P-type transistor is coupled to the first pad. A first S/D terminal of the first N-type transistor is coupled to the first common conductive line, a gate terminal of the first N-type transistor is coupled to the first ground voltage, and a second S/D terminal of the first N-type transistor is coupled to the first pad. Therefore, the present invention can efficiently introduce the ESD pulse from a pad to a system voltage or another pad for protecting the internal circuit from damage.

12 Claims, 6 Drawing Sheets

US 7,072,158 B2

ELECTROSTATIC DISCHARGE PROTECTION CIRCUIT

CROSS REFERENCE TO RELATED APPLICATIONS

This application claims the priority benefit of Taiwan application serial no. 92129873, filed Oct. 28, 2003.

BACKGROUND OF INVENTION

1. Field of the Invention

The present invention relates to an electrostatic discharge (ESD) protection circuit, and more particularly to an ESD protection circuit of integrated circuit.

2. Description of the Related Art

In electronic circuits, special in integrated circuits, such as memories or logic circuits, metal-oxide-semiconductor field effect transistors (MOSFET) are widely used therein. MOSFET are also generally applied to computers. Under the request of small size and low cost, the size of devices gradually shrinks. Accordingly, electrostatic discharge (ESD) protection is more and more important.

ESD generally includes Human-Body Mode (HBM), Machine Mode (MM) and Charge-Device Mode (CDM). Because electrostatic exists anywhere, internal circuits will be damaged without ESD protection circuit. Actually, ESD pulse has a higher voltage than that of the power voltage. When ESD happens, the gate $SiO_2$ layer of the MOS will be damaged because of the pulse. Therefore, how to protect internal circuits from ESD pulses is very essential and ESD protection circuits are then applied thereto.

FIG. 1A is a prior art ESD protection circuit. Referring to FIG. 1A, the internal circuit 110 represents the circuit needed to be protected. The power is supplied from the system voltage VDD and the ground voltage VSS. The pad 120 presents the connecting point of the internal circuit 110 for transmitting I/O signal 115, and can be, for example, an I/O pad. Usually, an ESD protection circuit is coupled to the pad 120 for introducing pulse charged to the pad 120 to another place without damaging the internal circuit 110. The diode 130 is used to introduce the positive ESD pulse to the system voltage VDD and the diode 140 serves to introduce the negative ESD pulse to the ground voltage VSS. The former is called the PD mode; the latter is called the NS mode. Although the prior art ESD protection circuit can introduce positive and negative ESD pulses to the system voltage VDD and the ground voltage VSS, respectively, the internal circuit 110 is still to be damaged because the negative ESD pulse only goes through the diode 140 and damages the parasitic NPN transistor.

FIG. 1B is another prior art ESD protection circuit. Referring to FIG. 1B, it has the same elements: internal circuit 110, pad 120 and I/O signal 115 of FIG. 1A. The ESD protection circuit usually applied to the pad of DRAM has two N-type transistors (NMOS). The gate terminal of the NMOS 150 is coupled to the ground voltage VSS, and the S/D terminals thereof are coupled to the system voltage VDD and pad 120, separately. The gate terminal of the NMOS 160 is coupled to the ground voltage VSS, and the S/D terminals thereof are coupled to the ground voltage VSS and pad 120, separately. The negative ESD pulse can go through the conductive lines of system voltage VDD and ground voltage VSS, rather than go to the internal circuit 110. This method is called ND mode. Although the prior art method can efficiently introduce the negative ESD pulse via the conductive lines of system voltage VDD and ground voltage VSS, it can not prevent the damage caused by the positive charge pulse.

FIG. 1C is the other prior art ESD protection circuit. Referring to FIG. 1C, it has the same elements: internal circuit 110, pad 120 and I/O signal 115 of FIG. 1A. The ESD protection circuit is composed of a NMOS and a PMOS. The gate terminal and one S/D terminal of the PMOS 170 are coupled to the system voltage VDD, and the other S/D terminal is coupled to the I/O signal 115. One S/D terminal of the NMOS 180 are coupled to the I/O signal 115, and the gate terminal and the other S/D terminal are coupled to the ground voltage VSS. The PMOS 170 is used to introduce the positive ESD pulse to the system voltage VDD; the NMOS 180 serves to introduce the negative ESD pulse to the ground voltage VSS. With the issue similar to the method shown in FIG. 1A, because the negative ESD pulse can only go through NMOS to the ground voltage VSS and damage the parasitic NPN transistor, the internal circuit 110 is still damaged.

FIG. 2 is a prior art ESD protection circuit with a multi-power system. Referring to FIG. 2, the circuit module 210 represents a prior art ESD protection circuit and a pad, wherein the internal circuit and conductive lines coupled to the pad are not shown. The system voltages VDD1 and VDD2 are coupled to the common conductive line VDD-common via different ESD conduction circuits 220. The ground voltages VSS1 and VSS2 are coupled to the common conductive line VSS-common via different ESD conduction circuits 220. The prior art ESD protection circuit with the multi-power system usually can not introduce a pulse to another pad. In addition, in the prior art ESD protection circuit with the multi-power system each voltage system requires an ESD clamp 230 to maintain the voltage difference.

Except of the prior art ESD protection circuits mentioned above, there are some complicated ESD protection circuits. However, the internal circuits therein are still damaged because the ESD protection circuit is distant from the pad or the ESD pulse does not go through the ESD protection circuit. U.S. Pat. No. 5,721,565 also discloses an ESD protection circuit having resistors and capacitors. The circuit is so complicated that the large circuit area and high cost occur.

SUMMARY OF INVENTION

Therefore, an object of the present invention is to provide an electrostatic discharge (ESD) protection circuit adapted to serve ESD protection of multi-power system and input/output pins and to discharge the ESD pulse for protecting internal circuits. The ESD protection circuit of the present invention can introduce an ESD pulse from a pad to another pad for protecting internal circuits. Compared with prior art, the present invention does not need the ESD clamp and reduces a big area of the chip.

Another object of the present invention is to provide an electrostatic discharge (ESD) protection circuit for modifying the circuit thereof for reducing chip size.

The other object of the present invention is to provide an electrostatic discharge (ESD) protection circuit for being applied to a single-power system.

The present invention discloses an ESD protection circuit coupled to a first pad of an integrated circuit. The integrated circuit has a plurality of system voltage sets including a first system voltage and a first ground voltage.

The ESD protection circuit comprises: a first common conductive line, a first diode, a first P-type transistor and a first N-type transistor. A cathode of the first diode is coupled to the first common conductive line and a anode of the first diode is coupled to the first system voltage. A first S/D terminal and a gate terminal of the first P-type transistor is coupled to the first system voltage and a second S/D terminal of the first P-type transistor is coupled to the first pad. A first S/D terminal of the first N-type transistor is coupled to the first common conductive line, a gate terminal of the first N-type transistor is coupled to the first ground voltage, and a second S/D terminal of the first N-type transistor is coupled to the first pad.

According to the ESD protection circuit of the present invention, the ESD protection circuit further comprises a second common conductive line, a second N-type transistor, a second diode and a third diode. A first S/D terminal of the second N-type transistor is coupled to the first pad and a gate terminal and a second S/D terminal of the second N-type transistor are coupled to the first ground voltage. An anode of the second diode is coupled to the first ground voltage, and a cathode of the second diode is coupled to the second common conductive line. An anode of the third diode is coupled to the second common conductive line, and a cathode of the third diode is coupled to the first ground voltage.

The present invention can be applied to a multi-power system. The preferred ESD protection circuit of the present invention can further be coupled to a second pad. The system voltage sets a second system voltage and a second ground voltage. The ESD protection circuit further comprises: a fourth diode, a second P-type transistor, a third N-type transistor, a fourth N-type transistor, a fifth diode and a sixth diode. A cathode of the fourth diode is coupled to the first common conductive line, and an anode of the fourth diode is coupled to the second system voltage. A first S/D terminal and a gate terminal of the second P-type transistor are coupled to the second system voltage, and a second S/D terminal of the second P-type transistor is coupled to the second pad. A first S/D terminal of the third N-type transistor is coupled to the first common conductive line, a gate terminal of the third N-type transistor is coupled to the second ground voltage, and a second S/D terminal of the third N-type transistor is coupled to the second pad. A first S/D terminal of the fourth N-type transistor is coupled to the second pad, a gate terminal and a second S/D terminal of the fourth N-type transistor is coupled to the second ground voltage. An anode of the fifth diode is coupled to the second ground voltage, and a cathode of the fifth diode is coupled to the second common conductive line. An anode of the sixth diode is coupled to the second common conductive line, and a cathode of the sixth diode is coupled to the second ground voltage.

The present invention discloses another ESD protection circuit coupled to a first pad of an integrated circuit. The integrated circuit has a plurality of system voltage sets including a first ground voltage. The ESD protection circuit comprises a first common conductive line, a first diode and a first N-type transistor. A cathode of the first diode is coupled to the first ground voltage, and an anode of the first diode is coupled to the first common conductive line. A first S/D terminal of the first N-type transistor is coupled to the first pad, a gate terminal and a substrate terminal of the first N-type transistor are coupled to the first ground voltage, and a second S/D terminal of the first N-type transistor is coupled to the first common conductive line.

According to the ESD protection circuit of the present invention, the system voltage sets further include a first system voltage, the ESD protection circuit further comprises a second common conductive line, a second diode, a first P-type transistor and a second N-type transistor. A cathode of the second diode is coupled to the second common conductive line, and an anode of the second diode is coupled to the first system voltage. A first S/D terminal and a gate terminal of the first P-type transistor are coupled to the first system voltage, and a second S/D terminal of the first P-type transistor is coupled to the first pad. A first S/D terminal of the second N-type transistor is coupled to the second common conductive line, a gate terminal of the second N-type transistor is coupled to the first ground voltage, and a second S/D terminal of the second N-type transistor is coupled to the first pad.

The present invention can be applied to a multi-power system. The preferred ESD protection circuit of the present invention can further be coupled to a second pad. The system voltage sets a second system voltage and a second ground voltage. The ESD protection circuit further comprises: a third diode, a third N-type transistor, a fourth diode, a second P-type transistor and a fourth N-type transistor. A cathode of the third diode is coupled to the second ground voltage, and an anode of the third diode is coupled to the first common conductive line. A first S/D terminal of the third N-type transistor is coupled to the second pad, a gate terminal and a substrate terminal of the third N-type transistor are coupled to the second ground voltage, and a second S/D terminal of the third N-type transistor is coupled to the first common conductive line. A cathode of the fourth diode is coupled to the second common conductive line, and an anode of the fourth diode is coupled to the second system voltage. A first S/D terminal and a gate terminal of the second P-type transistor are coupled to the second system voltage, and a second S/D terminal of the second P-type transistor is coupled to the second pad. A first S/D terminal of the fourth N-type transistor is coupled to the second common conductive line, a gate terminal of the fourth N-type transistor is coupled to the second ground voltage, and a second S/D terminal of the fourth N-type transistor is coupled to the second pad.

The present invention discloses the other ESD protection circuit coupled to a pad of an integrated circuit. The integrated circuit has a system voltage and a ground voltage. The ESD protection circuit comprises a P-type transistor, a first N-type transistor and a second N-type transistor. A first S/D terminal and a gate terminal of the P-type transistor are coupled to the system voltage, and a second S/D terminal of the P-type transistor is coupled to the pad. A first S/D terminal of the first N-type transistor is coupled to the system voltage, a gate terminal of the first N-type transistor is coupled to the ground voltage, and a second S/D terminal of the first N-type transistor is coupled to the pad. A first S/D terminal of the second N-type transistor is coupled to the pad, and a gate terminal and a second S/D terminal of the second N-type transistor are coupled to the ground voltage.

Because of the use of the P-type, N-type transistors and common conductive lines, the present invention can efficiently introduce an ESD pulse from a pad to another pad or system voltage for protecting internal circuits from damage resulting therefrom.

In order to make the aforementioned and other objects, features and advantages of the present invention understandable, a preferred embodiment accompanied with figures is described in detail below.

DETAILED DESCRIPTION

Figure 1A:
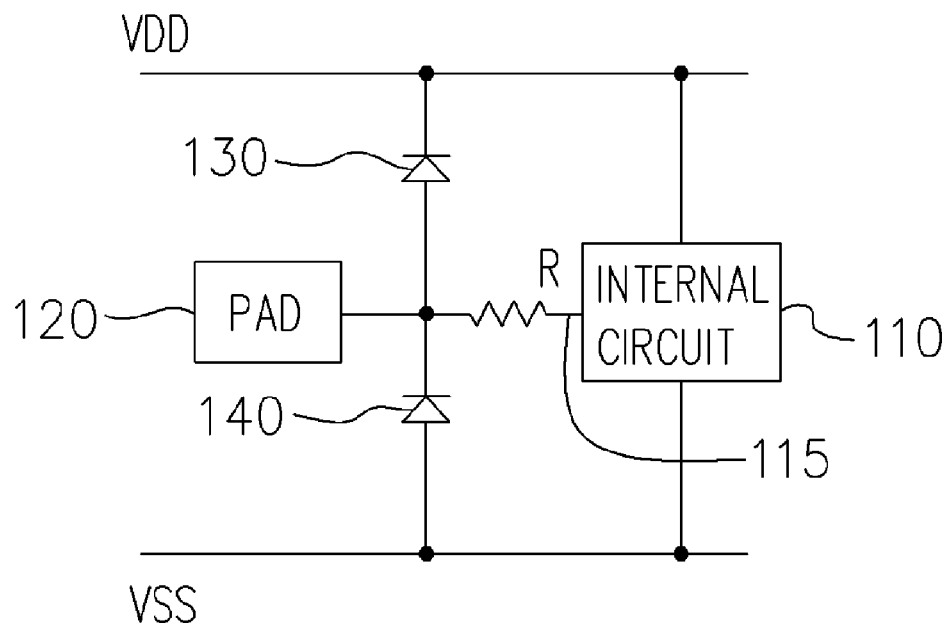
FIGS. 1A–1C are prior art ESD protection circuits.
Figure 1B:
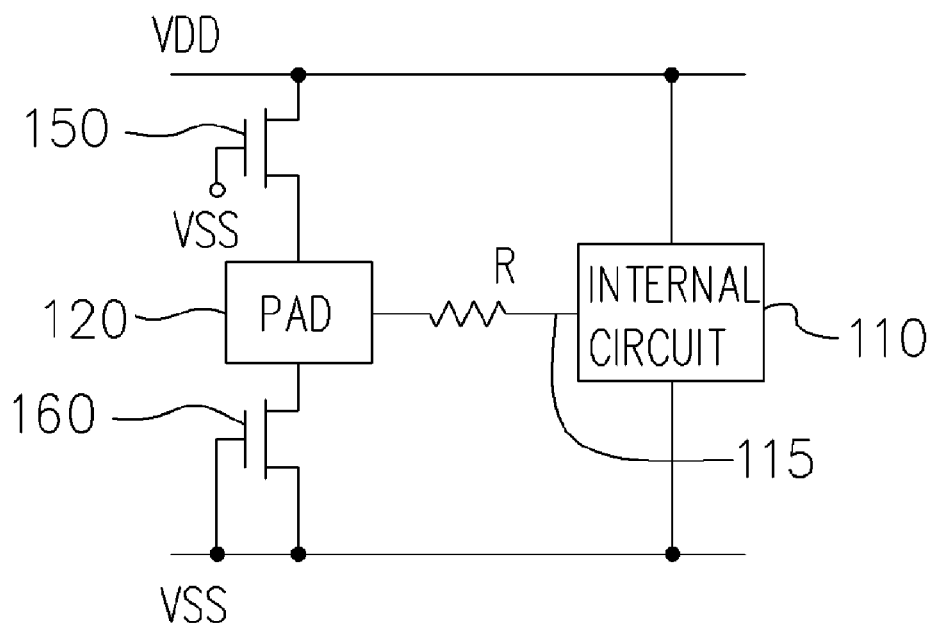
Figure 1C:
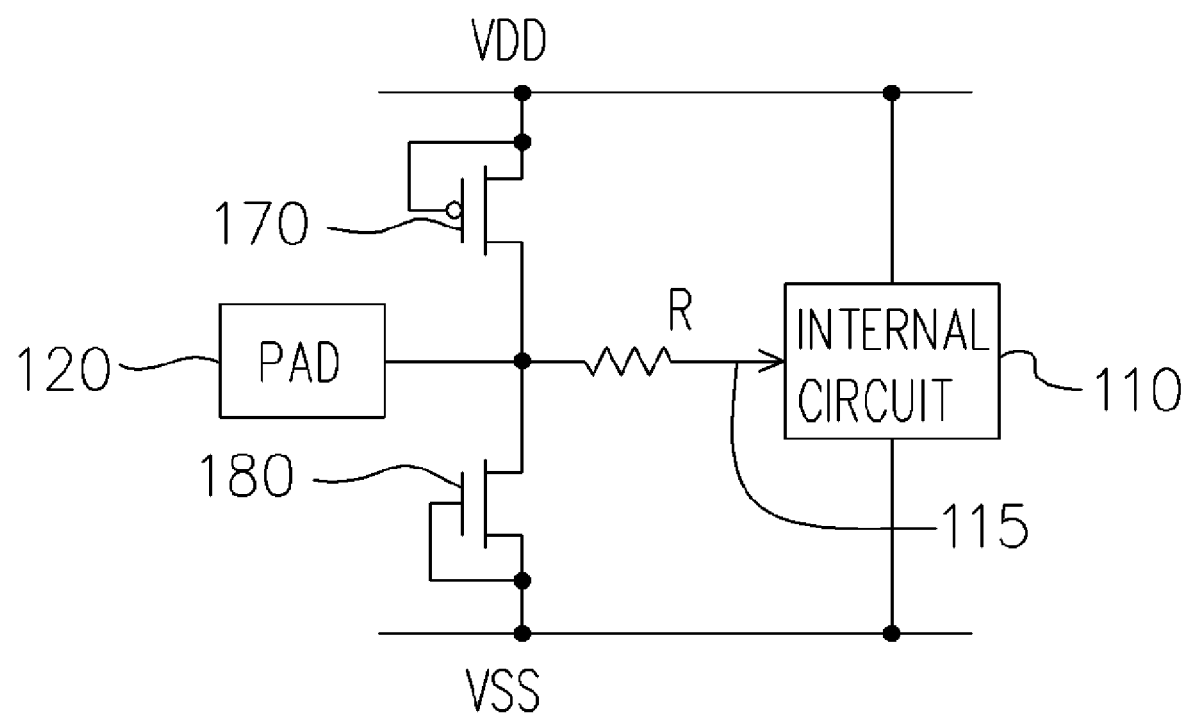
Figure 2:
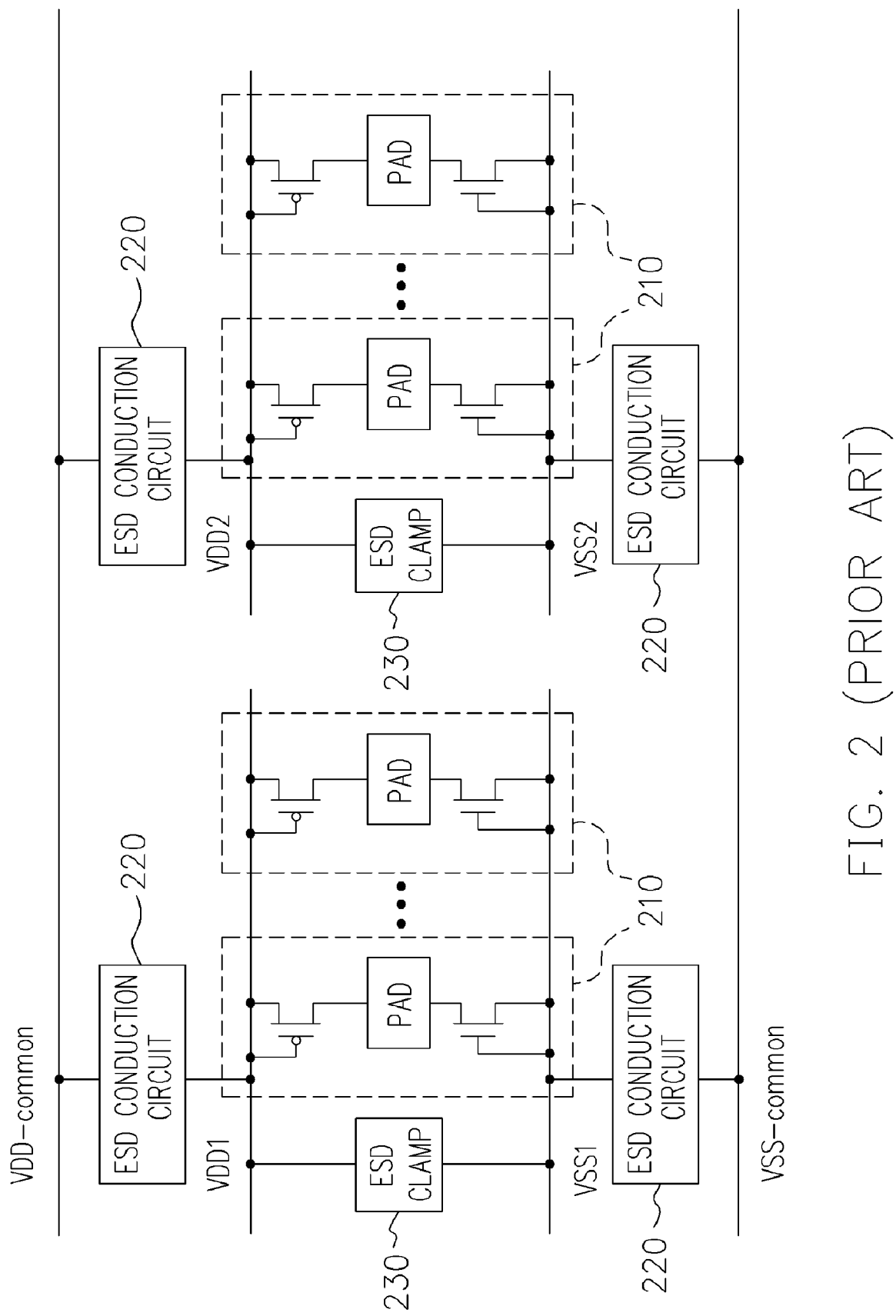
FIG. 2 is a prior are ESD protection circuit with a multi-power system.
Figure 3:
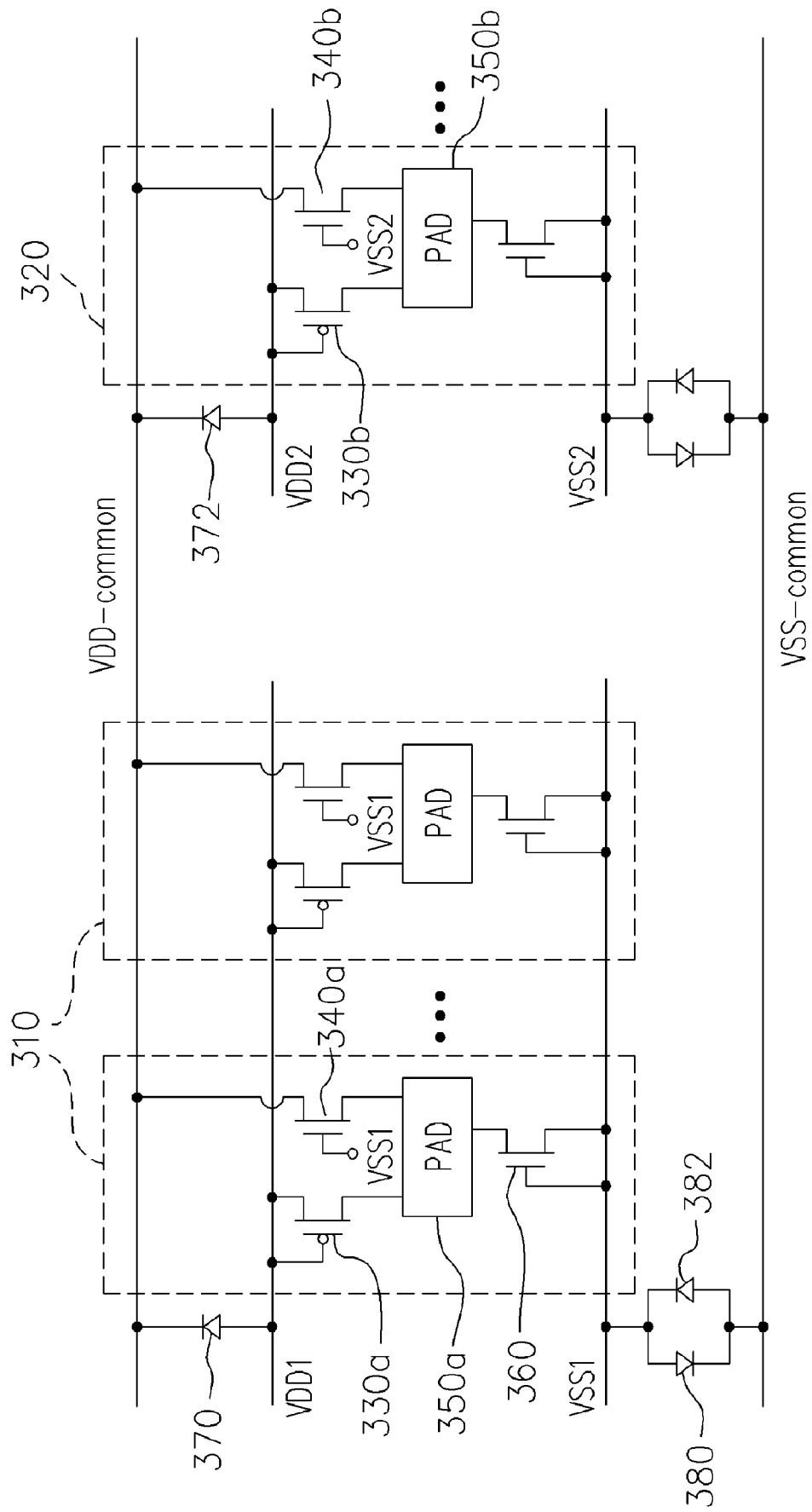
FIG. 3 is a schematic drawing showing a preferred ESD protection circuit in accordance with the present invention.

FIG. 3 is a schematic drawing showing a preferred ESD protection circuit in accordance with the present invention. The embodiment is described in an integrated circuit with a multi-power system. Referring to FIG. 3, it shows two power system sets VDD1/VSS1 and VDD2/VSS2. One of ordinary skill in the art will understand that the present invention can include more power systems. Each of the power system set can include three diodes for connecting with the common conductive line. For example, the system voltage VDD1 is coupled to the common conductive line VDD-common via the diode 370, and the ground voltage VSS1 is coupled to common conductive line VSS-common via the diodes 380 and 382. The cathode of the diode 370 is coupled to the common conductive line VDD-common and the anode of the diode 370 is coupled to the system voltage VDD1. The cathode of the diode 380 is coupled to the common conductive line VSS-common and the anode of the diode 380 is coupled to the ground voltage VSS1. The anode of the diode 382 is coupled to the common conductive line VSS-common and the cathode of the diode 382 is coupled to the ground voltage VSS1.

In the embodiment, each pad is coupled to an ESD protection circuit for protecting internal circuits (not shown) from damage. The pad and the ESD protection circuit responding thereto are called as input/output (I/O) unit. For example, the I/O unit 310 comprises a pad 350a, a P-type transistor 330a, a N-type transistor 340a and another N-type transistor 360. A first S/D terminal and a gate terminal of the P-type transistor 330a is coupled to the system voltage VDD1 and a second S/D terminal of the P-type transistor 330a is coupled to the pad 350a. A first S/D terminal of the N-type transistor 340a is coupled to the common conductive line VDD-common, a gate terminal of the N-type transistor 340a is coupled to the ground voltage VSS1, and a second S/D terminal of the N-type transistor 340a is coupled to the pad 350a. A first S/D terminal of the N-type transistor 360 is coupled to the pad 350a, and a gate terminal and a second S/D terminal thereof are coupled to the ground voltage VSS1.

If a positive ESD pulse is charged to the pad 350a, the P-type transistor 330a is turned on. The pulse will be introduced from the pad 350a to the common conductive line VDD-common via the P-type transistor 330a and the diode 370. Then it will be introduced out of the circuit through another pad. For example, the I/O unit 320 introduces the pulse on the common conductive line VDD-common to the pad 350b and out of the integrated circuit via the N-type transistor 340b.

If a negative ESD pulse is charged to the pad 350a, the N-type transistor 340a is turned on. The pulse will be introduced from the pad 350a to the common conductive line VDD-common via the N-type transistor 340a. Then it will be introduced out of the circuit through another pad. For example, the I/O unit 320 introduces the pulse on the common conductive line VDD-common to the pad 350b and out of the integrated circuit via the diode 372 and the P-type transistor 330b.

The present invention also can introduce the pulse to another power system. If the ESD pulse charged to the pad 350a is a positive charge pulse, the positive ESD pulse from the pad 350a will be introduced to the system voltage VDD2 through the pad 350b and the P-type transistor 330b, and out of the circuit. If the ESD pulse charged to the pad 350a is a negative charge pulse, the negative ESD pulse from the pad 350a will be introduced to the system voltage VDD2 through the N-type transistor 340a, the common conducive line VDD-common and the diode 372. Additionally, the negative ESD pulse from the pad 350a will be introduced to the system voltage VDD1 through the N-type transistor 340a, the common conducive line VDD-common and the diode 370.

Figure 4:
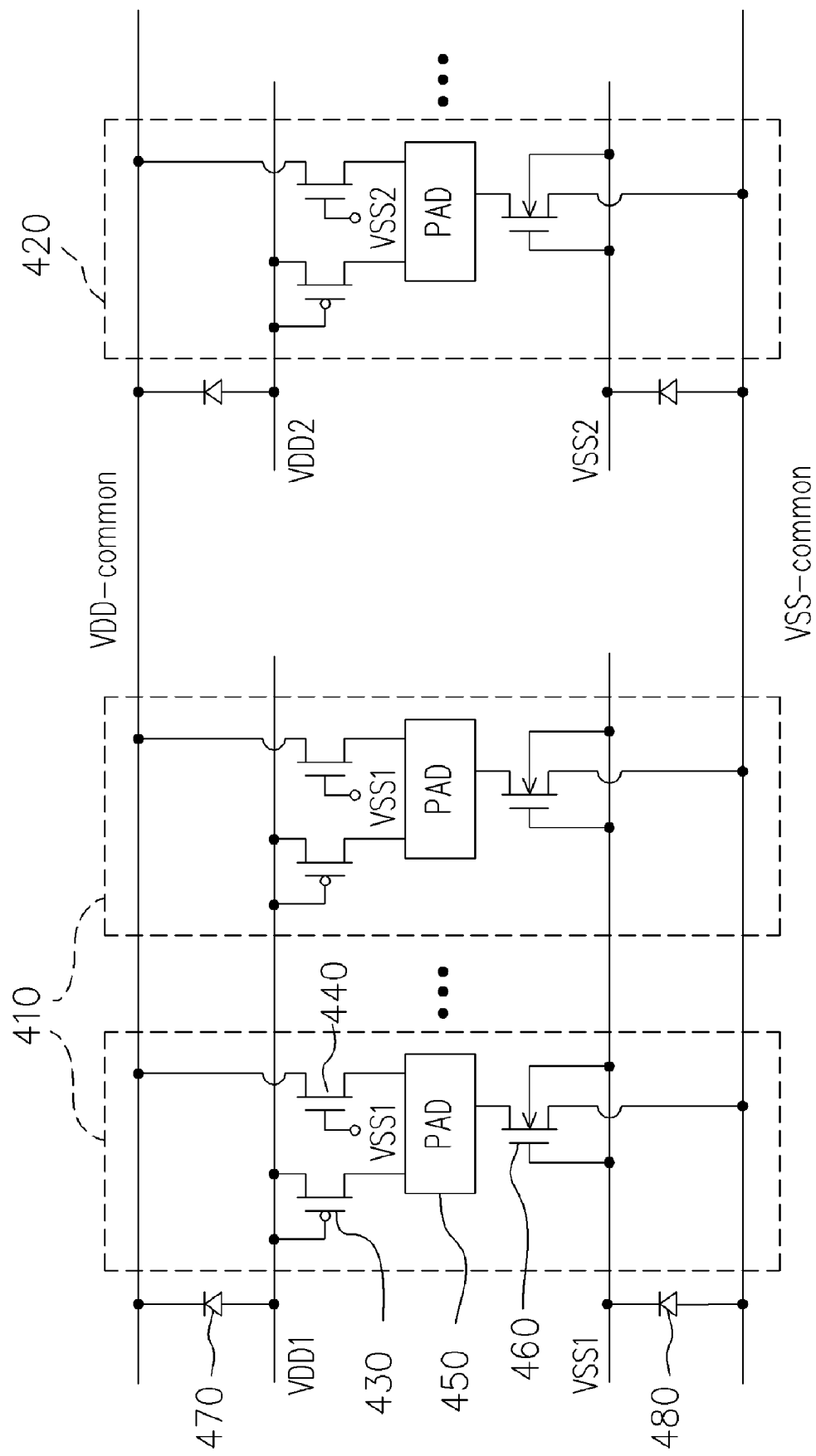
FIG. 4 is a schematic drawing showing another preferred ESD protection circuit of the present invention.

Following is another preferred ESD protection circuit of the present invention. FIG. 4 is a schematic drawing showing another preferred ESD protection circuit of the present invention. Similarly, the embodiment is described in the integrated circuit with a multi-power system. Referring to FIG. 4, it shows two power system sets VDD1/VSS1 and VDD2/VSS2. One of ordinary skill in the art will understand that the present invention can include more power systems. Each of the power system set can include two diodes for connecting with the common conductive line. For example, the system voltage VDD1 is coupled to the common conductive line VDD-common via the diode 470, and the ground voltage VSS1 is coupled to common conductive line VSS-common via the diode 480. The cathode of the diode 470 is coupled to the common conductive line VDD-common and the anode of the diode 470 is coupled to the system voltage VDD1. The cathode of the diode 480 is coupled to the ground voltage VSS1 and the anode of the diode 480 is coupled to the common conductive line VSS-common.

In the embodiment, each pad is coupled to an ESD protection circuit for protecting internal circuits (not shown) from damage. The pad and the ESD protection circuit responding thereto are called as input/output (I/O) unit. The I/O units 410 and 420 represent different voltage system sets. For example, the I/O unit 410 comprises a pad 450, a P-type transistor 430, a N-type transistor 440 and another N-type transistor 460. A first S/D terminal and a gate terminal of the P-type transistor 430 is coupled to the system voltage VDD1 and a second S/D terminal of the P-type transistor 430 is coupled to the pad 450. A first S/D terminal of the N-type transistor 440 is coupled to the common conductive line VDD-common, a gate terminal of the N-type transistor 440 is coupled to the ground voltage VSS1, and a second S/D terminal of the N-type transistor 440 is coupled to the pad 450. A first S/D terminal of the N-type transistor 460 is coupled to the pad 450, a gate terminal and a substrate terminal thereof are coupled to the ground voltage VSS1, and a second S/D terminal thereof is coupled to the common conductive line VSS-common.

Figure 5:
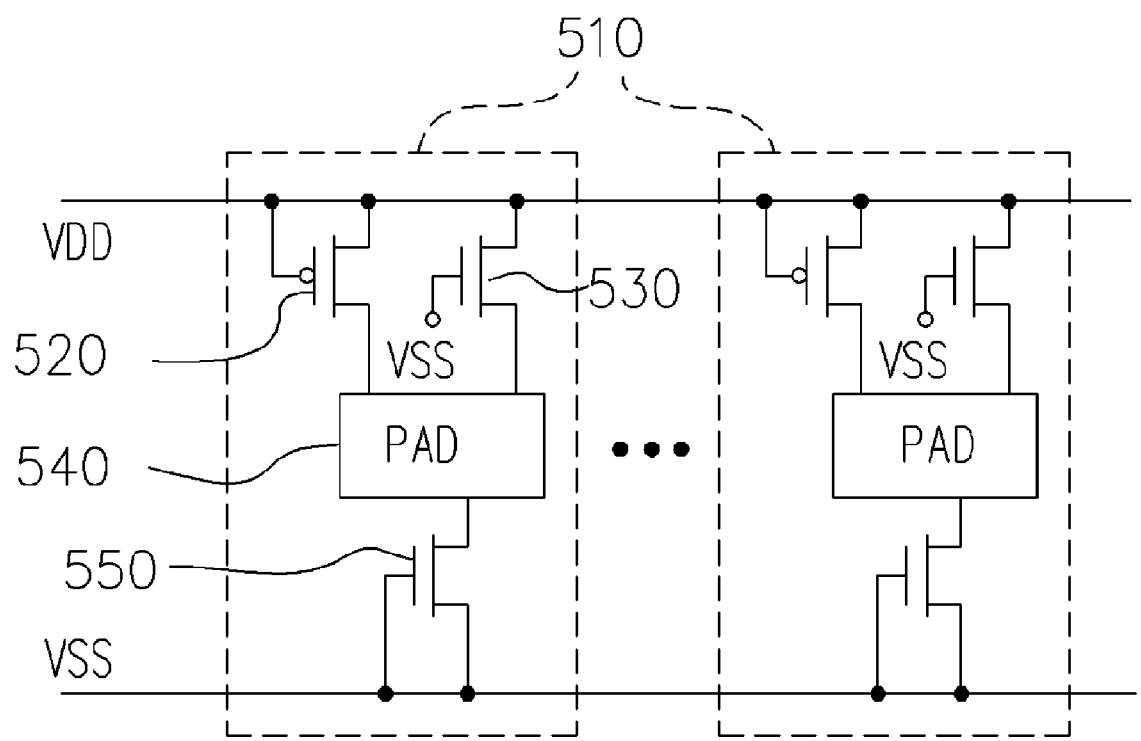
FIG. 5 is a schematic drawing showing a preferred ESD protection circuit with a single-power system of the present invention.

The present invention can also be applied to an integrated circuit with a single-power system. Following is the description thereof. FIG. 5 is a schematic drawing showing a preferred ESD protection circuit with a single-power system of the present invention. In the embodiment, each pad is coupled to an ESD protection circuit for protecting internal circuits (not shown) from damage. The pad and the ESD protection circuit responding thereto are called as input/output (I/O) unit. Referring to FIG. 5, the I/O unit 510 comprises a pad 540, a P-type transistor 520, an N-type transistor 530 and another N-type transistor 550. A first S/D terminal of the N-type transistor 550 is coupled to the pad 540, and a gate terminal and a second S/D terminal of the N-type transistor 550 are coupled to the ground voltage VSS. A first S/D terminal of the N-type transistor 530 is coupled to the system voltage VDD, a gate terminal of the N-type transistor 530 is coupled to the ground voltage VSS, and a second S/D terminal of the N-type transistor 530 is coupled to the pad 540. A first S/D terminal and a gate terminal of the P-type transistor 520 is coupled to the system voltage VDD and a second S/D terminal of the P-type transistor 430 is coupled to the pad 540.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. An electrostatic discharge (ESD) protection circuit coupled to a first pad of an integrated circuit, the integrated circuit having a plurality of system voltage sets, the system voltages including a first system voltage and a first ground voltage, the ESD protection circuit comprising:
   a first common conductive line;
   a first diode, a cathode of the first diode coupled to the first common conductive line, an anode of the first diode coupled to the first system voltage;
   a first P-type transistor, a first S/D terminal and a gate terminal of the first P-type transistor coupled to the first system voltage, a second S/D terminal of the first P-type transistor coupled to the first pad; and
   a first N-type transistor, a first S/D terminal of the first N-type transistor directly coupled to the first common conductive line, a gate terminal of the first N-type transistor coupled to the first ground voltage, a second S/D terminal of the first N-type transistor coupled to the first pad.

2. The ESD protection circuit of claim 1, further comprising a second N-type transistor, a first S/D terminal of the second N-type transistor coupled to the first pad, a gate terminal and a second S/D terminal of the second N-type transistor coupled to the first ground voltage.

3. The ESD protection circuit of claim 2, further comprising:
   a second common conductive line;
   a second diode, an anode of the second diode coupled to the first ground voltage, a cathode of the second diode coupled to the second common conductive line; and
   a third diode, an anode of the third diode coupled to the second common conductive line, a cathode of the third diode coupled to the first ground voltage.

4. The ESD protection circuit of claim 1, wherein the ESD protection circuit is coupled to a second pad of the integrated circuit, the plurality of system voltage sets further comprises a second system voltage and a second ground voltage, and the ESD protection circuit further comprises:
   a fourth diode, a cathode of the fourth diode coupled to the first common conductive line, an anode of the fourth diode coupled to the second system voltage;
   a second P-type transistor, a first S/D terminal and a gate terminal of the second P-type transistor coupled to the second system voltage, a second S/D terminal of the second P-type transistor coupled to the second pad; and
   a third N-type transistor, a first S/D terminal of the third N-type transistor coupled to the first common conductive line, a gate terminal of the third N-type transistor coupled to the second ground voltage, a second S/D terminal of the third N-type transistor coupled to the second pad.

5. The ESD protection circuit of claim 4, further comprising a fourth N-type transistor, a first S/D terminal of the fourth N-type transistor coupled to the second pad, a gate terminal and a second S/D terminal of the fourth N-type transistor coupled to the second ground voltage.

6. The ESD protection circuit of claim 5, further comprising:
   a second common conductive line;
   a fifth diode, an anode of the fifth diode coupled to the second ground voltage, a cathode of the fifth diode coupled to the second common conductive line; and
   a sixth diode, an anode of the sixth diode coupled to the second common conductive line, a cathode of the sixth diode coupled to the second ground voltage.

7. An electrostatic discharge (ESD) protection circuit coupled to a first pad of an integrated circuit, the integrated circuit having a plurality of system voltage sets, the system voltages including a first ground voltage, the ESD protection circuit comprising:
   a first common conductive line;
   a first diode, a cathode of the first diode coupled to the first ground voltage, an anode of the first diode coupled to the first common conductive line; and
   a first N-type transistor, a first S/D terminal of the first N-type transistor coupled to the first pad, a gate terminal and a substrate terminal of the first N-type transistor coupled to the first ground voltage, a second S/D terminal of the first N-type transistor coupled to the first common conductive line.

8. The ESD protection circuit of claim 7, wherein the plurality of voltage systems further comprises a first system voltage, and the ESD protection circuit further comprises:
   a second common conductive line;
   a second diode, a cathode of the second diode coupled to the second common conductive line, an anode of the second diode coupled to the first system voltage;
   a first P-type transistor, a first S/D terminal and a gate terminal of the first P-type transistor coupled to the first system voltage, a second S/D terminal of the first P-type transistor coupled to the first pad; and
   a second N-type transistor, a first S/D terminal of the second N-type transistor coupled to the second common conductive line, a gate terminal of the second N-type transistor coupled to the first ground voltage, a second S/D terminal of the second N-type transistor coupled to the first pad.

9. The ESD protection circuit of claim 7, wherein the ESD protection circuit is coupled to a second pad of the integrated circuit, the plurality of system voltage sets further comprises a second ground voltage, and the ESD protection circuit further comprises:
   a third diode, a cathode of the third diode coupled to the second ground voltage, an anode of the third diode coupled to the first common conductive line; and
   a third N-type transistor, a first S/D terminal of the third N-type transistor coupled to the second pad, a gate terminal and a substrate terminal of the third N-type transistor coupled to the second ground voltage, a second S/D terminal of the third N-type transistor coupled to the first common conductive line.

10. The ESD protection circuit of claim 9, wherein the system voltages further comprises a second system voltage, and the ESD protection circuit further comprises:
- a second common conductive line;
- a fourth diode, a cathode of the fourth diode coupled to the second common conductive line, an anode of the fourth diode coupled to the second system voltage;
- a second P-type transistor, a first S/D terminal and a gate terminal of the second P-type transistor coupled to the second system voltage, a second S/D terminal of the second P-type transistor coupled to the second pad; and
- a fourth N-type transistor, a first S/D terminal of the fourth N-type transistor coupled to the second common conductive line, a gate terminal of the fourth N-type transistor coupled to the second ground voltage, a second S/D terminal of the fourth N-type transistor coupled to the second pad.

11. An electrostatic discharge (ESD) protection circuit coupled to a pad of an integrated circuit, the integrated circuit having a system voltage and a ground voltage, the ESD protection circuit comprising:
- a P-type transistor, a first S/D terminal and a gate terminal of the P-type transistor coupled to the system voltage, a second S/D terminal of the P-type transistor coupled to the pad;
- a first N-type transistor, a first S/D terminal of the first N-type transistor directly coupled to the system voltage, a gate terminal of the first N-type transistor coupled to the ground voltage, a second S/D terminal of the first N-type transistor coupled to the pad; and
- a second N-type transistor, a first S/D terminal of the second N-type transistor coupled to the pad, a gate terminal and a second S/D terminal of the second N-type transistor coupled to the ground voltage.

12. The ESD protection circuit of claim 11, further comprising a diode, a cathode of the diode coupled to a common conductive line, an anode of the diode coupled to the system voltage.

* * * * *